United States Patent

Brunner et al.

[11] Patent Number: 5,834,773
[45] Date of Patent: *Nov. 10, 1998

[54] METHOD AND APPARATUS FOR TESTING THE FUNCTION OF MICROSTRUCTURE ELEMENTS

[75] Inventors: Matthias Brunner, Kirchheim; Hans-Peter Feuerbaum, München; Jürgen Frosien, Riemerling, all of Germany

[73] Assignee: Ebetech Electron-Beam Technology Vertriebs GmbH, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 659,337

[22] Filed: Jun. 6, 1996

[30] Foreign Application Priority Data

Jul. 10, 1995 [DE] Germany .................. 195 25 081.8

[51] Int. Cl.⁶ .................................................. G01R 31/265
[52] U.S. Cl. ...................... 250/310; 250/307; 250/214 R; 250/214.1; 250/552; 250/553
[58] Field of Search .................................... 250/310, 307, 250/214 R, 214.1, 552, 553

[56] References Cited

U.S. PATENT DOCUMENTS

| 3,443,166 | 5/1969 | Ing, Jr. et al. | 250/552 |
| 4,885,534 | 12/1989 | Eck et al. | 250/310 |
| 5,338,932 | 8/1994 | Theodore et al. | 250/307 |
| 5,378,902 | 1/1995 | Pankove et al. | 250/214 R |

*Primary Examiner*—Jack I. Berman
*Attorney, Agent, or Firm*—Reising, Ethington, Learman & McCulloch, PLLC

[57] ABSTRACT

The invention relates to a method as well as to apparatus for testing the function of microstructure elements, wherein the microstructure element is driven for testing the emission and/or mechanical properties and the corpuscles emitted or reflected by it are detected and evaluated.

19 Claims, 5 Drawing Sheets

METHOD AND APPARATUS FOR TESTING THE FUNCTION OF MICROSTRUCTURE ELEMENTS

The invention relates to a method and to apparatus for testing the function of microstructure elements.

BACKGROUND OF THE INVENTION

The term microstructure elements is understood to mean for example micromechanical sensors and actors, as well as elements (for example laser diodes or field emission tips) which emit corpuscular radiation (for example light or electrons). Such microstructure elements are in each case produced in large numbers on a substrate, for example wafers.

In microstructure technology mechanical, optical, electrical and other components are produced using methods which are related to the processes in microelectronics. Analogously, corresponding faults also occur in the production, caused for example by contaminations or faulty adjustments. In order to be able to guarantee satisfactory function of the microstructure elements, therefore, it is necessary to test the function of each individual element.

Due to the small dimensions the testing of microstructure elements makes special requirements of the method used and the corresponding apparatus. The rapid measurement of the electrical function of transistors, conductors as well as of capacitances and resistors is known for example from U.S. Pat. No. 3,531,716 and EP-A-0 048 862. These known methods are based essentially on the fact that with the aid of an electron beam the electrical charge at a specific location on the component is measured by means of triggered secondary electrons.

The object of the invention is to provide a method as well as apparatus for testing microstructure elements with which it is possible to test functions of the microstructure elements which have not previously been checked.

SUMMARY OF THE INVENTION

According to the invention the emission and/or mechanical properties of microstructure elements can be tested by driving the microstructure element and detecting and evaluating the corpuscles emitted or reflected by it. Emitted corpuscles should be understood to mean those corpuscles which are emitted in the normal operation of the microstructure element.

This method makes it possible for example to check arrays of field emission tips, such as are used for example for flat display screens, with regard to their emission properties. Defective emitters can then possibly be repaired or the entire array is sorted out in order to save on the further working steps which are then unnecessary. Diamond field emitters can be checked in the same way.

A further field of use is in the checking of arrays of micromechanical mirrors, such as are used for example for projection displays. The individual mirror elements are mechanically deflected by a specific amount by their driving means. The insufficient deflection of individual elements leads to errors in the image generation. Therefore in this case, too, it is necessary to check the function of the individual element in order to guarantee satisfactory function.

THE DRAWINGS

Further advantages and developments of the invention are explained in greater detail below with reference to the description of some embodiments and to the drawings, in which.

DETAILED DESCRIPTION

Figure 1:
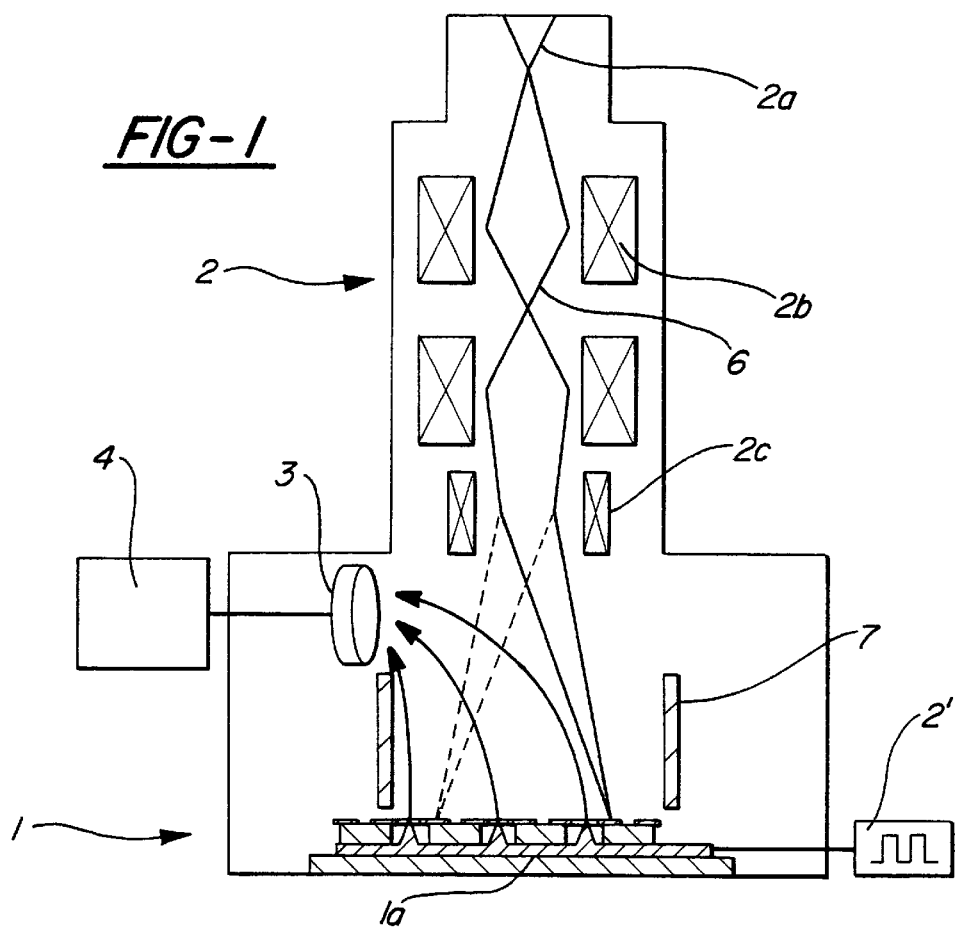
FIG. 1 shows a schematic representation of an apparatus for testing the function of microstructure elements.

The apparatus according to the invention which is shown in FIG. 1 and serves for testing the function of microstructure elements comprises an arrangement 1 for receiving a specimen with at least one microstructure element, an arrangement 2 for driving the microstructure element, a detector 3 which is sensitive to the corpuscles emitted or reflected by the microstructure element, as well as an arrangement 4 for evaluating output signals from the detector 3 with regard to the emission and/or mechanical properties of the microstructure element.

The arrangement 1 for receiving the specimen has in particular a correspondingly constructed specimen table 1a which is optionally movable in a number of directions, as well as a vacuum chamber which is not shown in greater detail.

The arrangement 2 for driving the microstructure element 5 essentially comprises a source 2a for generating a corpuscular beam and is formed for example by an electron source, a lens system 2b to direct the corpuscular beam onto the microstructure element 5 as well as a deflector 2c to direct the corpuscular beam 6 onto another microstructure element. The source 2a can also for example be formed by an ion source. The lens system 2b essentially consists of magnetic and/or electrostatic lenses.

The arrangement for driving the microstructure elements can also be formed for example by a control unit 2' which is connected by way of electrical contacts to the microstructure element.

Depending upon the type of microstructure elements to be examined, the detector is sensitive for electrons, ions or photons. A deflector system consisting of electrical electrodes can be used for example to guide the corpuscles emitted or reflected by the microstructure element towards the detector. In order to be able to ascertain the energy of these corpuscles, the detector 3 is operated for example in conjunction with a counterfield spectrometer connected before it.

Some embodiments of the invention will now be explained in greater detail with reference to FIGS. 2 to 10, wherein FIGS. 2 to 6 show the testing of emitters with regard to their emission properties.

The emitters to be examined here are to be understood to be microstructure elements which by driving emit corpuscles. Such emitters may be formed for example by field emission tips or laser diodes.

Figure 2:
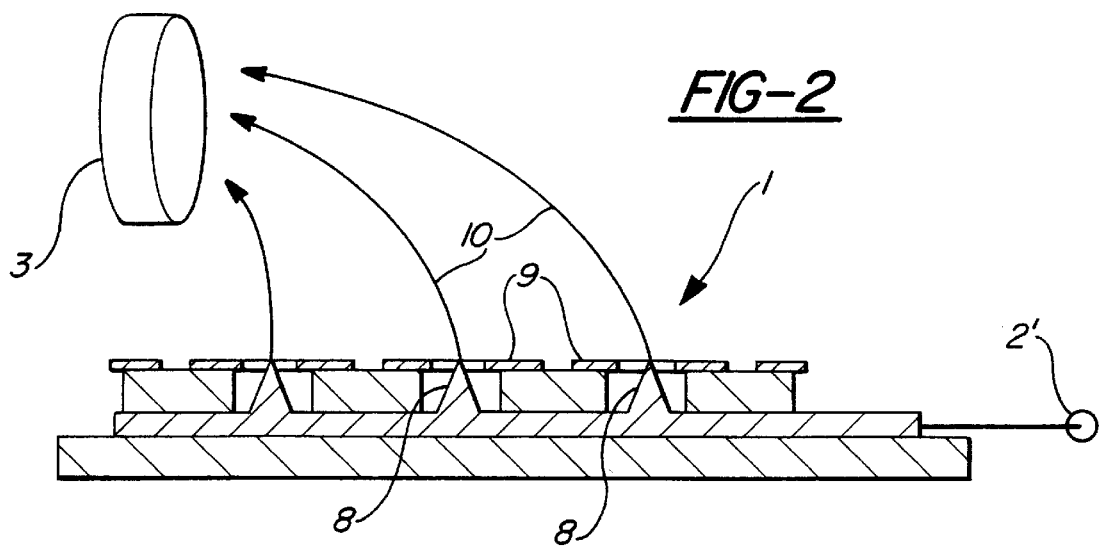
FIGS. 2 to 6 show schematic representations of various methods of testing the function of emitters.

FIG. 2 shows a plurality of field emission tips 8 disposed on a substrate with corresponding feeds 9. The field emission tips 8 are driven by way of an arrangement 2' which is connected thereto in such a way that the field emission tips trigger corpuscles 10, in this case electrons. These corpuscles 10 are guided onto the detector 3 by way of the deflector system 7 shown by way of example in FIG. 1. The signal produced in the detector 3 is evaluated in the subsequent arrangement 4.

Figure 3:
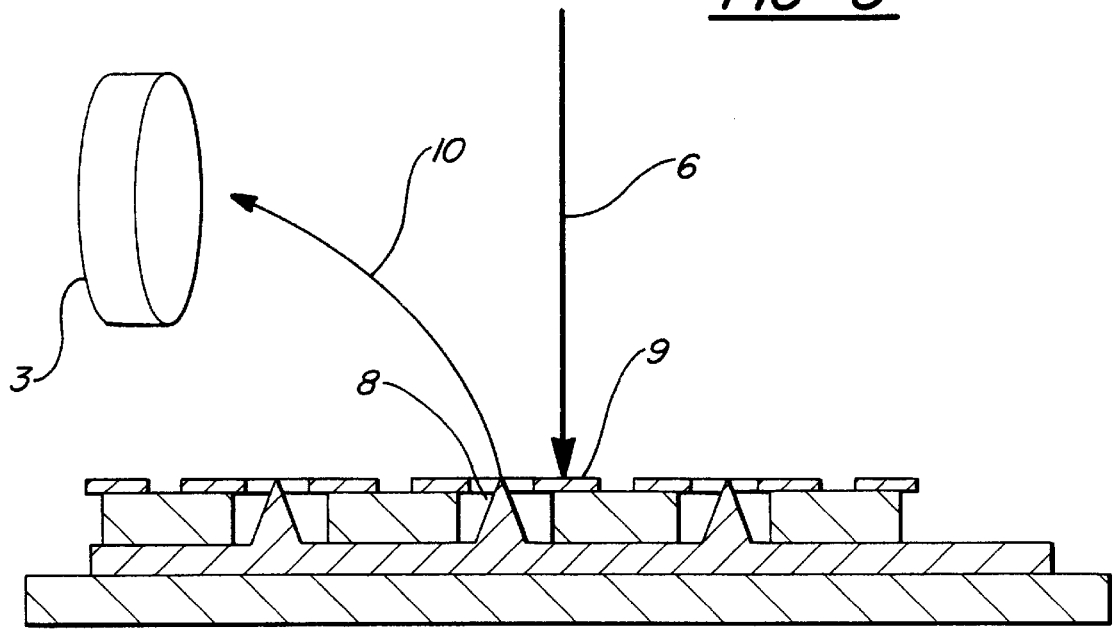
Figure 4:
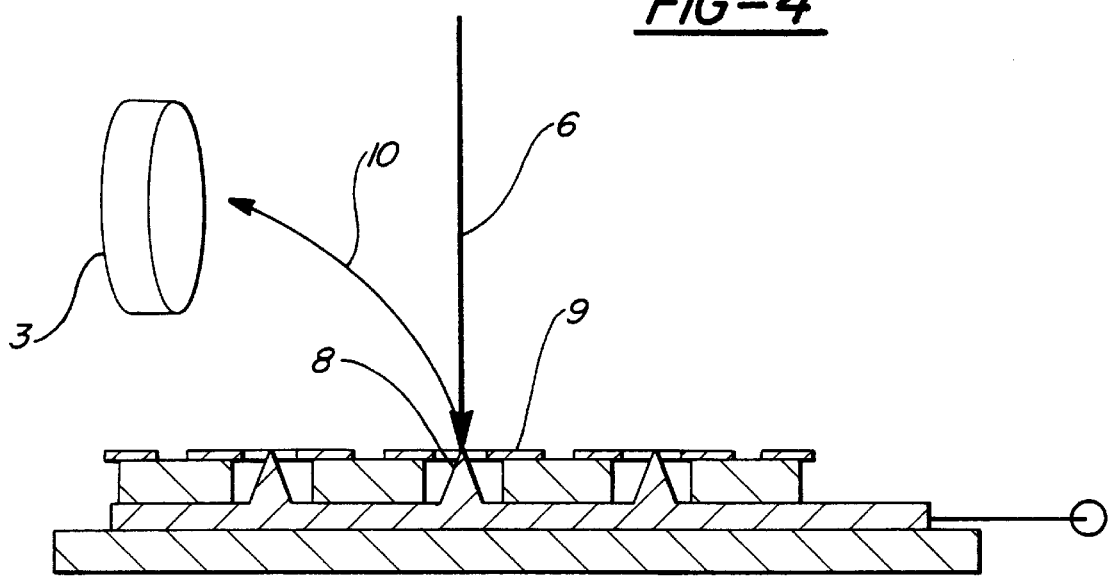

In the embodiment illustrated in FIG. 3 the field emission tips 8 are not driven by way of an external electrically connected arrangement but are excited by the corpuscular beam 6 directed onto the feed 9 for emission of corpuscles 10. The corpuscles 10 are then again guided onto the detector 3 in order to be further evaluated. The analysis of the detected signal, i.e. the output signal of the detector as a reaction to the driving, produces the information on the defective or correct function of the microstructure element.

However, the emitter 8, i.e. the field emission tips 8, can be driven by the corpuscular beam 6 not only by way of its feeds 9 but also by directing the corpuscular beam directly onto the emitter 8, and in particular on to the tip thereof. The corpuscles 10 triggered thereby are again guided onto the detector 3 and further evaluated.

Figure 5:
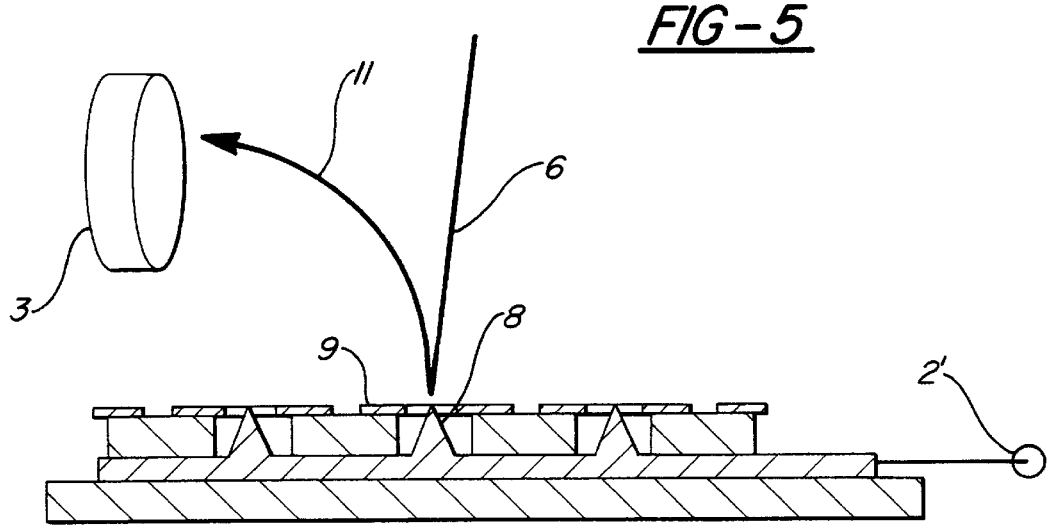

In FIG. 5 a further method of testing emitters is described in which the emitter 8 is driven by an electrically connected arrangement 2' in such a way that a voltage is applied to the emitter which is not yet sufficient to trigger corpuscles. If under these test conditions a corpuscular beam 6 is guided directly onto the emitter, for example the tip of the field emission tip 8, the incident corpuscles are reflected as a function of the voltage applied to the emitter. The corpuscles 11 which strike the detector 3 and are reflected pass again to the detector 3. The subsequent evaluation allows direct conclusions to be reached as to the voltage applied to the emitter.

Figure 6:
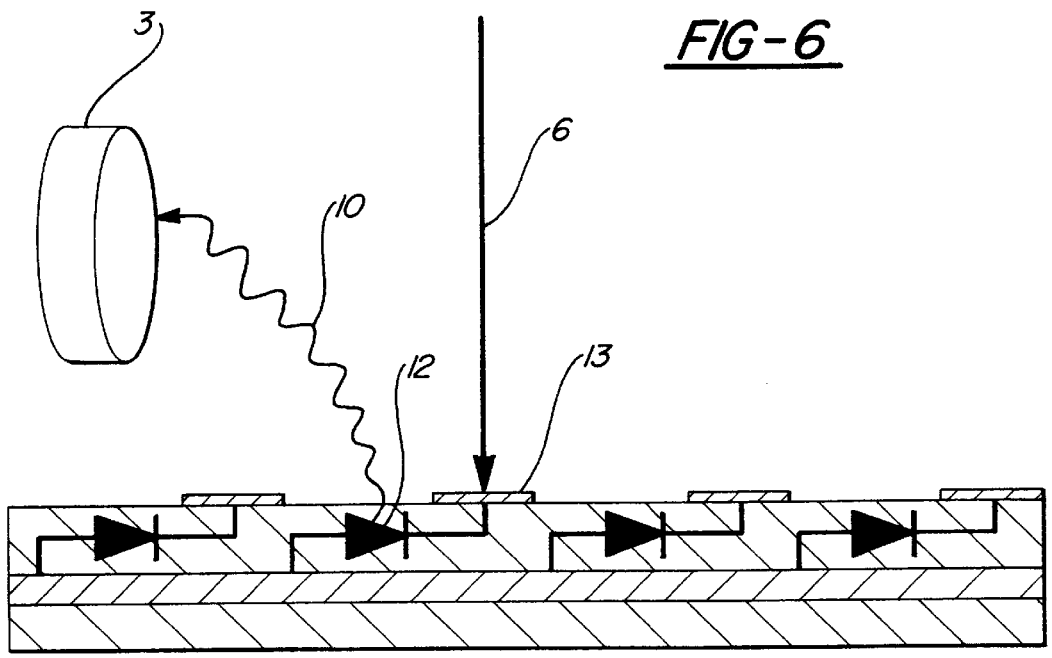
Figure 7:
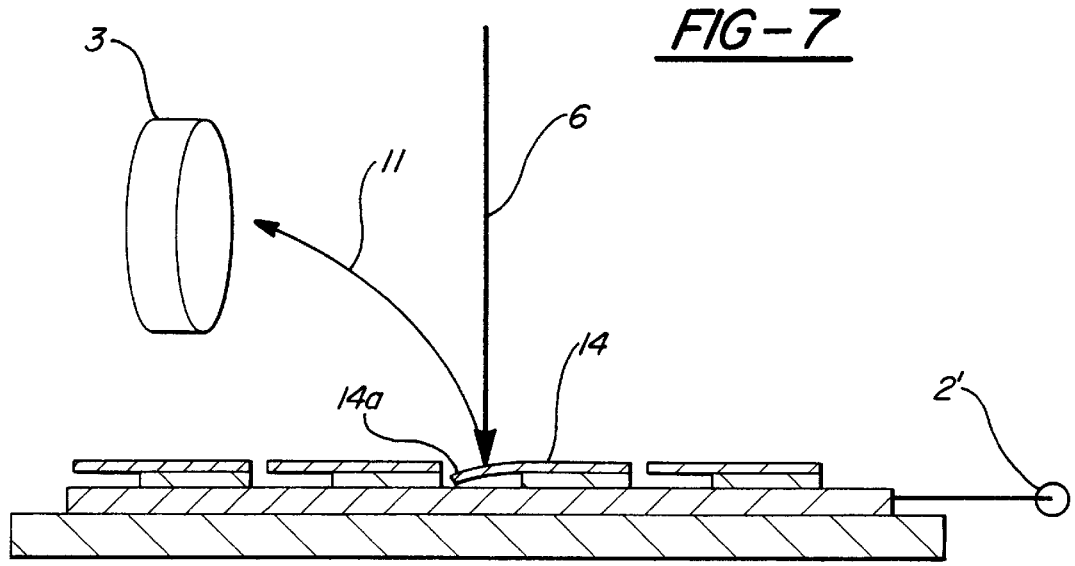
FIG. 7 shows a schematic representation of a method of testing the function of mechanically operating microstructure elements.

A further embodiment according to the invention is illustrated in FIG. 6, in which the microstructure elements are formed by laser diodes 12 which can be driven by way of feeds 13. The driving may again take place either by a corpuscular beam 6 directed onto the feed 13 or by a driving arrangement which is electrically connected to the feed 13 and is not shown in greater detail. As a consequence of the driving, corpuscles 10 are again emitted by the laser diode 12, these corpuscles being formed in this embodiment by photons. The emitted photons again pass to the detector 3, the output signal of which is evaluated in the subsequent evaluation arrangement 4.

Apart from the previously described emitters, however, it is also possible to check mechanically operating microstructure elements by means of the method according to the invention. Thus, for example, arrays of micromechanical mirrors are employed which are used for projection displays. Such an array is formed by a plurality of individually deflectable mirrors, a case in which there is also a requirement to check the function of each individual microstructure element. A corresponding arrangement is shown schematically in FIG. 7. The individual micromechanical mirrors 14 can be driven by way of an electrically connected arrangement 2'. The driving effects a deflection of the mirror surface 14a. During the testing process the corpuscular beam 6 is directed onto the deflectable mirror surface 14a. With correct deflection the reflected corpuscles pass onto the detector 3. Thus with the aid of the corpuscular beam 6 the correct deflection of a movable microstructure element can be checked in a particularly simple way.

Depending upon the type of microstructure elements it may in certain circumstances be sensible to dispose a plurality of detectors in a suitable manner in order to check various deflected positions of the microstructure element. However, the various deflected positions can also be tested with the aid of a detector surface if in the various deflected positions of the mirror the corpuscular beam 6 in each case strikes the mirror surface at a different angle of incidence.

With the aid of the method according to the invention it is possible to test all microstructure elements which have at least one movable element which can be deflected by a corresponding driving means. The driving can again take place either by an electrical y connected driving arrangement 2' or also by a corpuscular beam. In all cases a corpuscular beam is directed onto the movable element, in this case the mirror surface 14a, in order to establish the serviceability of the microstructure elements with the aid of the reflected corpuscles.

In the testing of a plurality of microstructure elements disposed on a substrate there is a requirement to be able to carry out the process as quickly as possible.

Figure 8:
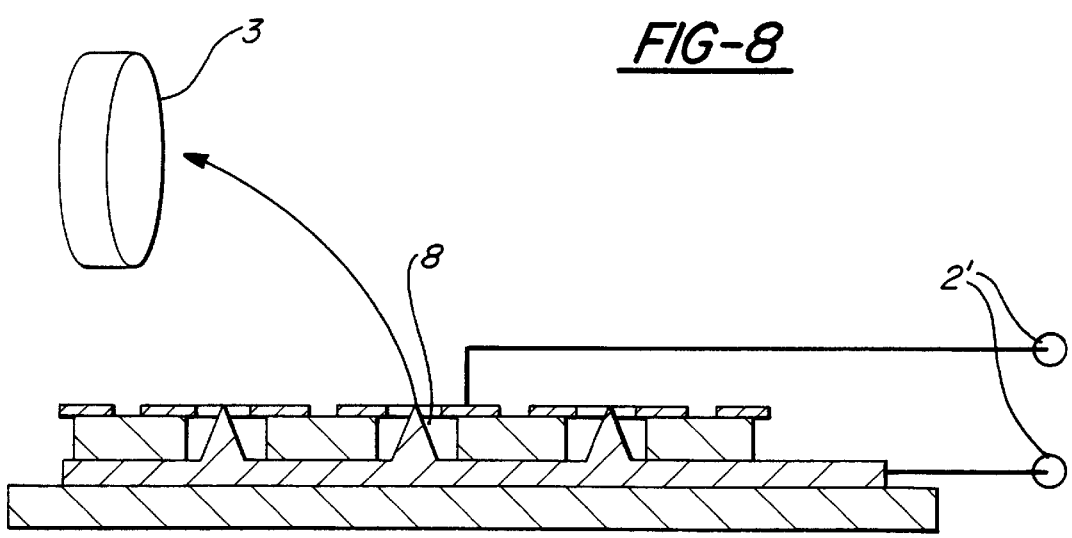
FIGS. 8 to 10 show a schematic representation of various possibilities for detecting the emitted or reflected corpuscles.

In principle it is possible to drive each individual microstructure element, for example the field emission tips 8, individually by way of an arrangement 2' or a corpuscular beam and to guide the emitted or reflected corpuscles onto the detector 3 (FIG. 8).

Figure 9:
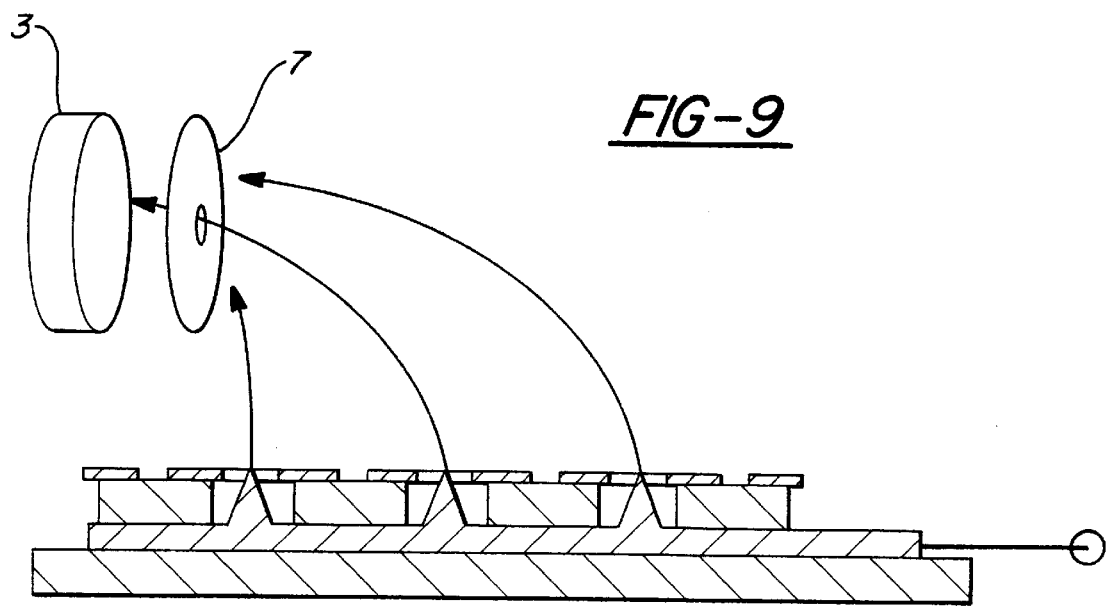

However, it is also possible to drive a plurality of microstructure elements for the emission or reflection of corpuscles, in which case with the aid of a deflector system 7 mounted before the detector only emitted or reflected corpuscles of a microstructure element in each case pass to the detector 3. The deflector system 7 illustrated in FIG. 9 is shown in the form of a diaphragm which is for example movable in a suitable manner. The deflector system 7 could, however, also take the form of electrical electrodes, for example plate electrodes, cf. FIG. 1 in this connection.

Figure 10:
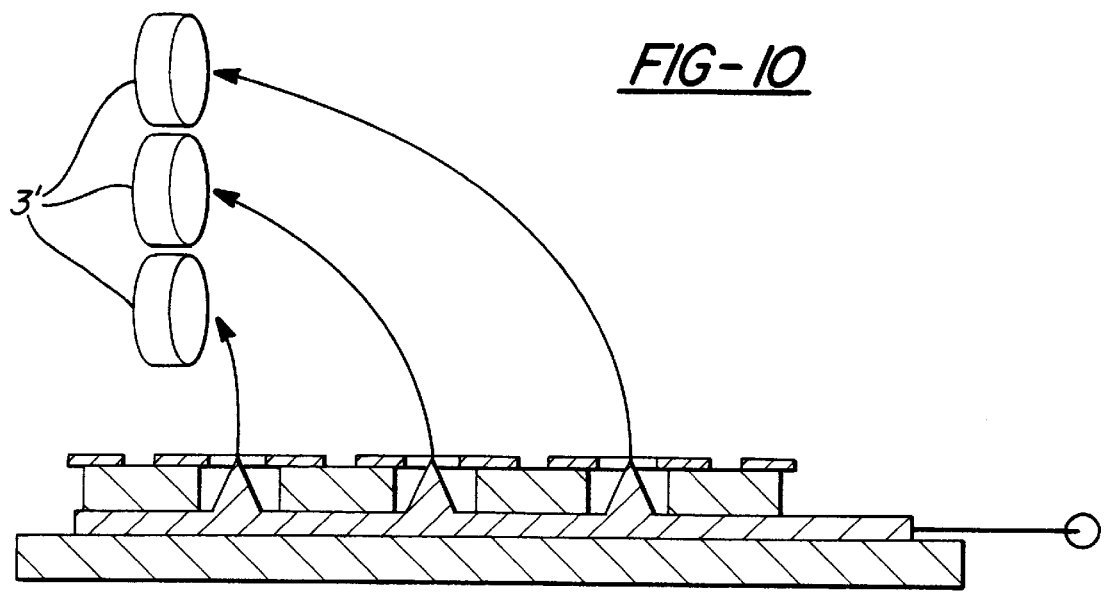

In the embodiment illustrated in FIG. 10 the corpuscles emitted or reflected by a plurality of driven microstructure elements are guided onto a plurality of detectors 3'. The detectors 3' can for example be formed by a detector array.

Finally, it is also possible to guide the corpuscles from a plurality of microstructure elements simultaneously onto the detector 3, in order then to establish with the aid of the intensity of the received corpuscles whether one of the driven microstructure elements may be defective.

The microstructure elements set out in the above embodiments and the arrangement thereof with respect to the detector as well as driving thereof should be understood to be merely by way of example. The detector 3, 3' can be designed for example for ascertaining the intensity of the detected corpuscles. However, it is also conceivable to ascertain the energy of the emitted or reflected corpuscles in order to draw conclusions therefrom as to the function of the examined microstructure elements. The energy of the corpuscles may be ascertained for example by a generally known counterfield spectrometer which is connected upstream for quantitative potential measurement.

The corpuscular beams used for driving the microstructure elements or the corpuscles emitted or reflected by the microstructure elements can be formed by electrons, ions or photons.

The evaluation of the output signal of the detector 3 in the subsequent arrangement 4 can be carried out for example by comparison of the measured actual signal with a desired signal.

We claim:

1. A method of testing the function of microstructure elements comprising the steps of:

driving a selected one of the microstructure elements; and detecting and evaluating corpuscular radiation emitted by said microstructure element against a predetermined standard to determine whether said microstructure element is functioning satisfactorily in accordance with the standard, the corpuscular radiation being characteristic of that produced by the microstructure element during normal operation.

2. The method of claim 1 wherein said microstructure element is driven by irradiating said microstructure element with a corpuscular beam.

3. The method of claim 2 wherein said corpuscular radiation produced by said microstructure element is generated by reflecting corpuscles of said beam off said microstructure element.

4. The method of claim 1 wherein said microstructure element is driven electrically to cause said microstructure element to emit said corpuscular radiation.

5. The method of claim 1 including mounting a plurality of said microstructure elements on a supporting body prior to testing.

6. The method of claim 5 wherein the plurality of said microstructure elements are detected and evaluated individually in predetermined succession.

7. The method of claim 5 wherein the plurality of said microstructure elements are driven simultaneously.

8. The method of claim 5 wherein the corpuscular radiation produced by the plurality of said microstructure elements is detected simultaneously.

9. The method of claim 1 wherein said microstructure element is driven by application of an electrical charge to said element.

10. The method of claim 1 wherein said microstructure element is driven by application of energy to said element.

11. The method of claim 1 including ascertaining the intensity of the corpuscular radiation produced by said microstructure element.

12. The method of claim 1 including ascertaining the energy of the corpuscular radiation produced by said microstructure element.

13. The method of claim 1 wherein the elements to be tested are emitters which when driven emit said corpuscular radiation.

14. Apparatus for testing the function of microstructure elements to detect and evaluate corpuscular radiation emitted thereby, said apparatus comprising:

means to receive and support at least one microstructure element to be tested;

means for driving the microstructure element to cause said microstructure element to emit corpuscular radiation, the corpuscular radiation being characteristic of that produced by the microstructure element during normal operation;

a corpuscular detector operative to sense the corpuscular radiation emitted by the microstructure element and produce output signals representative of said sensed corpuscular radiation; and an analyzing device operative to receive and evaluate said output signals of said detector against a predetermined standard to determine whether the microstructure element is performing satisfactorily in accordance with said standard.

15. The apparatus of claim 14 wherein said means to receive and support said microstructure element includes a vacuum chamber.

16. The apparatus of claim 14 wherein said means for driving said microstructure element comprises: a) a source for generating a corpuscular beam; b) a lens device to direct said corpuscular beam onto the microstructure element; and c) a deflector device to direct the corpuscular beam onto another microstructure element.

17. The apparatus of claim 14 wherein said means for driving the microstructure element comprises an electrical control unit having contacts coupling said unit to the microstructure element.

18. The apparatus of claim 14 including a deflector device arranged in relation to said detector to guide the corpuscular radiation produced by the microstructure element onto said detector.

19. The apparatus of claim 18 wherein said deflector device comprises electrodes.

* * * * *

UNITED STATES PATENT AND TRADEMARK OFFICE
CERTIFICATE OF CORRECTION

PATENT NO.    : 5,834,773
DATED         : November 10, 1998
INVENTOR(S)   : Matthias Brunner and Hans-Peter Feuerbaum It is certified that error appears in the above-indentified patent and that said Letters Patent is hereby corrected as shown below:

Column 2, line 35, change "essentially consists of" to -- comprises --.

Column 4, line 3, change "electrical y" to -- electrically --.

Signed and Sealed this

Thirteenth Day of April, 1999

Attest:

Q. TODD DICKINSON

*Attesting Officer*                    Acting Commissioner of Patents and Trademarks